(12) United States Patent
Nishida et al.

(10) Patent No.: US 7,123,379 B2
(45) Date of Patent: Oct. 17, 2006

(54) COLOR PROOFING METHOD AND APPARATUS, AND RECORDED MEDIUM ON WHICH COLOR PROOFING PROGRAM IS RECORDED

(75) Inventors: Nobukatsu Nishida, 31-27, Nango 2-chome, Otsu-shi, Shiga 520-0865 (JP); Kazuyuki Uragami, 7-10, Higashitsukamoto-cho, Shimogamo, Sakyo-ku, Kyoto-shi, Kyoto 606-0855 (JP); Makoto Ito, 2-13-403, Tomioka 2-chome, Urayasu-shi, Chiba 279-0021 (JP); Naoto Takeda, Kyoto (JP)

(73) Assignees: Sagawa Printing Co., Ltd., Kyoto (JP); Nobukatsu Nishida, Shiga (JP); Kazuyuki Uragami, Kyoto (JP); Makoto Ito, Chiba (JP); Fusoc Precision Co., Ltd., Kyoto (JP)

( * ) Notice: Subject to any disclaimer, the term of this patent is extended or adjusted under 35 U.S.C. 154(b) by 1094 days.

(21) Appl. No.: 10/052,122

(22) Filed: Jan. 17, 2002

(65) Prior Publication Data
US 2002/0080378 A1 Jun. 27, 2002

(30) Foreign Application Priority Data
Jul. 19, 1999 (WO) ............... PCT/JP99/03886

(51) Int. Cl.
*G06K 1/00* (2006.01)
*G06K 9/00* (2006.01)
*G03F 3/08* (2006.01)
*G03B 27/04* (2006.01)

(52) U.S. Cl. ............... 358/1.9; 358/518; 358/523; 358/3.23; 382/167; 355/85

(58) Field of Classification Search .......... 358/1.9, 358/518, 523, 3.23; 382/167; 355/85
See application file for complete search history.

(56) References Cited

U.S. PATENT DOCUMENTS 5,333,069 A * 7/1994 Spence ............... 358/517
5,781,709 A * 7/1998 Usami et al. ........... 358/1.9
5,835,244 A * 11/1998 Bestmann ............ 358/523

FOREIGN PATENT DOCUMENTS

EP 0 779 736 A2 6/1997

* cited by examiner

Primary Examiner—Kimberly Williams
Assistant Examiner—Charlotte M. Baker
(74) Attorney, Agent, or Firm—Hodgson Russ LLP

(57) ABSTRACT

In a method for improving the color reproducibility of printed matter to be produced by a printing press in proof print produced by a proof press, a look-up table containing converted values of image data over the entire color space with respect to the proof press is created, the look-up table is corrected based on the color of a printing paper for the printing press and a paper exposed area factor in the proofing, and proof print is created by the use of the corrected look-up table. Furthermore, proof printing image data, in which each of levels of monochromatic color gradation of black on the printed matter is represented on the proof print, out of the proof printing image data over the entire color space in a subtractive process resulting from color matching between proof print by the proof press and the printed matter by means of the printing press is corrected in such a manner that a part having a black ink area factor of 100% on the printed matter is represented only with black ink also on the proof print, but that a part other than the part having a black ink area factor of 100% on the printed matter is represented on the proof print by using under color removal, so that the representing characteristics of the black ink on the printed matter are reproduced on the proof print.

15 Claims, 6 Drawing Sheets

COLOR PROOFING METHOD AND APPARATUS, AND RECORDED MEDIUM ON WHICH COLOR PROOFING PROGRAM IS RECORDED

CROSS-REFERENCE TO RELATED APPLICATION

This application claims priority from PCT/JP99/03886.

TECHNICAL FIELD OF THE INVENTION

The present invention relates to a color proofing method and apparatus for improving the color reproducibility of printed matter to be produced by a printing press in proof print produced by a proof press in a printing process.

BACKGROUND ART

Color correction is conducted prior to printing performed by a printing press. The color correction is conducted in order to check finish of printing, for example, 1) the presence or absence of a typographical error or gap, 2) the presence or absence of dust, a flaw, a smear or the like, 3) gradation reproducibility such as brightness or darkness of printed matter, 4) the color reproducibility of the printed matter, 5) the sharpness of the printed matter, and the like.

The color correction is generally conducted on the basis of proof printing performed by a proof press. In particular, computerization of pre-printing processing has been progressed in recent years, and therefore, there has been prevailed a digital proof press which can produce proof print directly based on digital data by means of an ink jet system or a sublimation thermal ink-transfer system.

In this case, color matching method is an important technique, in which a color reproducing region of the proof print produced by the proof press is approximated to that of printed matter to be produced by a printing press, thereby producing a visually similar result.

However, in many cases, the respective color reproducing regions inherent to the printed matter and the proof print are different from each other, and thus, it is very difficult to accurately approximate the color reproducing regions to each other.

For example, black (Bk) ink is generally used in addition to three primary colors in a subtractive process, i.e., cyan (C), magenta (M) and yellow (Y) in a printing process. The use of the Bk ink produces an economic effect such as ink saving by expressing an Indian ink character mainly used on a printing paper with monochromatic color ink as well as a quality improvement effect owing to an increase in density region in a high density part or color reproducing region.

There are two methods for making the black Bk from the three colors C, M and Y: a full-black method and a skeleton black method.

Assuming that the colors C, M and Y are uniformly mixed into the black Bk, a value min(CMY), i.e., a minimum value out of values of the colors C, M and Y is replaced with the black Bk, thereby achieving representation with the three colors. This is a method for maximizing a value replaced with the black Bk, and is referred to as the full black method. In an example illustrated in FIG. 5, out of the values of the three colors, i.e., C being 72%, M being 94% and Y being 43%, the minimum value Y is replaced with the black Bk, and further, is subtracted from the values of C and M. In this case, the amount equal to 43%×2 of ink is saved.

In the full-black method, scum of the black Bk ink occurs at a highlight part, which, therefore, looks dirt. Thus, as illustrated in FIG. 6, the value min(CMY) is not wholly replaced with the black Bk, but partly remains. This method is referred to as the skeleton black method.

The ink colors C, M, Y and Bk are relative to each other. The ink colors C, M, Y and Bk of printed matter produced by a printing press are different from those of proof print produced by a color printing press. Moreover, even the ink colors C, M, Y and Bk of one and the same printed matter slightly look different according to manufacturers. In view of this, the colors cannot be simply compared with each other as they are. Additionally, in comparison of the colors between a monitor and a color printing press, three colors R, G and B are used in the monitor, and therefore, respective color spaces in the monitor and the color printing press are different from each other.

Therefore, there has been conceived a method for, on the presumption of an absolute color space independent of color representing means, replacing color represented objects in the absolute color space so as to compare them with each other. This is referred to as a device independent color.

The absolute color space originally signifies an xyz space which is obtained by numerating a stimulus value with respect to human eyes. Since this space is a markedly distorted space, it is not suitable for perceiving a color difference. Therefore, there has been proposed a space rearranged in a uniformly three-dimensional space (a uniform color space). Currently, an Lab space is mainly used as the uniform color space. Since the uniform color space is the Euclidean space, the color difference is readily obtained.

In actual color management, all of the color of the printed matter by the printing press, and the color of the proof print by the color printing press and the color of the monitor are measured by a spectrophotometer, and then, their color reproducing regions are represented with the Lab values. Here, the colors can be simply compared with each other because of the same color space. Consequently, one of the color reproducing regions is compressed to the other, thereby achieving color matching. This is referred to as Gamut Mapping.

Here, since the color space after the color matching is the Lab space, the Lab space is converted again into respective relative color spaces, thereby obtaining actual conversion values. FIG. 7 illustrates an example in which the above-described procedures are applied to the color matching between the printed matter and the proof print.

In this manner, the device independent color is a remarkably effective color management technique. However, there arises a serious problem in view of representation of the black color. That is, since the black is a color which is artificially created, the original value of the black Bk is lost when the colors C, M, Y and Bk are converted to the colors in the Lab space, which are further converted again to the colors C, M, Y and Bk. Namely, in this case, there exists no reversibility between the colors C, M, Y and Bk before and after the conversion.

The most adverse effect on the actual processing is that a part having an area factor of 100% of the black mainly used in the representation of an Indian ink character or the like (C=M=Y=0, Bk=100) is lost, resulting in three or four colors (for example, C=71, M=75, Y=85 and Bk=35). In other words, the Indian ink character cannot be sharply represented, and further, the ink need be used in a greater quantity.

Moreover, in the printing process, in the case where color proof of offset lithography or gravure printing is performed by the use of a color printing press, a paper which can be used in the color printing press for performing the proofing is different from a paper which can be used in a printing press for performing main printing (hereinafter referred to as "a printing paper") in most cases. In particular, special papers need be used in an ink jet printing press, a sublimation thermal ink-transfer type printing press or the like, and therefore, the same paper as the printing paper cannot be used in fact.

If printing papers are different, it is more difficult to approximate the proof print to the printed matter.

In view of this, there has been conventionally a method for reproducing the color of the printing paper on image data so as to visually approximate the proof print to the printing paper. In this method, it is possible to reproduce the printing paper in proofing with relative ease unless a paper special to the color printing press has so extreme a color as to prevent reproducibility of the color of the printing paper, thereby obtaining the proof print which can be more approximated to the printed matter.

However, in this method, there arises a problem not in a region on the proof print, to which no ink is transferred, i.e., a blank region, but in a region to which the ink is transferred, as follows: if the color of the paper is added to only the blank region to which no ink is transferred, the color of the paper is not added to the region to which the ink is transferred, and therefore, the original color remains as it is.

Since printing gradation representation is principally area gradation, the color of the ink and the color of the paper basically looks mixed in a visual way. In other words, the color of the paper visually has an effect on the color of the ink. This effect is particularly shown more at a highlight part having a low ink area factor, so that the effect of the color of the paper visually becomes greater.

Another method for approximating the proof print to the printed matter in the case where the printing papers are different is a method for uniformly adding the color of the paper to the entire printing image. This method is further classified into a method for adding the color of the printing paper to image data and a method for printing a printing image after previous printing of the color of the printing paper over the entire special paper. In the above-described methods, the color matching between the proof print and the printed matter becomes excellent at the highlight part with relative accuracy, but the exposure area of the color of the paper is small from an intermediate part to a shadow part, and the color of the paper largely has an effect even on a region which hardly gets an effect by the color of the paper, whereby a color reproducing region of the proof print is markedly deviated from a color reproducing region of the printed matter.

Thus, a problem to be solved by the present invention is to improve the color reproducibility of the printed matter by means of the printing press in proofing by the proof press, in particular, by the color printing press.

Moreover, another problem to be solved by the present invention is to reproduce the color of the printing paper by means of the printing press, so as to reproduce the representing characteristics of the black ink on the printed matter.

DISCLOSURE OF THE INVENTION

In order to solve the above-described problems, according to the present invention, there is provided a color proofing method for improving the color reproducibility of printed matter to be produced by a printing press in proof print produced by a proof press, the color proofing method comprising the steps of: creating a look-up table containing converted values of image data over the entire color space with respect to the proof press; correcting the look-up table based on the color of printing paper for the printing press and a paper exposed area factor in the proof print; making proof print by the use of the corrected look-up table; in the case where the proof print is produced based on area gradation and the colors of the printing paper for the printing press and a printing paper for the proof press are approximated to each other to such an extent as not to need to take the ink transmittance into account, the step of correcting the look-up table includes the steps of: determining a paper exposed area factor $\alpha$ in accordance with the following equation when arbitrary reference data P in the look-up table has color values (Cp, Mp, Yp, Bkp), each of which is N-bit data:

$$\alpha = (1 - Cp/(2^N-1)) \times (1 - Mp/(2^N-1)) \times (1 - Yp/(2^N-1)) \times (1 - Bkp/(2^N-1)),$$

in contrast, determining the paper exposed area factor $\alpha$ in accordance with the following equation when the arbitrary reference data P in the look-up table has the color values (Cp, Mp, Yp, Bkp), each of which is percentage data:

$$\alpha = (1Cp/100) \times (1 - Mp/100) \times (1 - Yp/100) \times (1 - Bkp/100);$$

and determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci' = Ci + Ca \times \alpha, \ Mi' = Mi + Ma \times \alpha, \ Yi' = Yi + Ya \times \alpha \text{ and } Bki' = Bki + Bka \times \alpha,$$

to thus replace the color values of the reference data with the corrected values.

Furthermore, in order to solve the above-described problems, according to the present invention, there is provided a color proofing method for improving the color reproducibility of printed matter to be produced by a printing press in proof print produced by a proof press, the color proofing method comprising the steps of: creating a look-up table containing converted values of image data over the entire color space with respect to the proof press; correcting the look-up table based on the color of printing paper for the printing press and a paper exposed area factor in the proof print; making proof print by the use of the corrected look-up table; in the case where the proof print is produced based on both of density gradation and area gradation and the colors of the printing paper for the printing press and a printing paper for the proof press are approximated to each other to such an extent as not to need to take the ink transmittance into account, the step of correcting the look-up table includes the steps of: specifying an influence range defining how far reference data is influenced in the color space when the color values of the printing paper for the printing press are added to the color space; and determining an influence value for each of the reference data based on the color values of the paper and the value of the influence range, to thus add the influence value to the reference data.

Moreover, in order to solve the above-described problems, according to the present invention, there is provided a color proofing method for improving the color reproducibility of printed matter to be produced by a printing press in proof print produced by a proof press, the color proofing method comprising the steps of: creating a look-up table containing converted values of image data over the entire color space with respect to the proof press; correcting the look-up table based on the color of printing paper for the printing press and a paper exposed area factor in the proof print; making proof print by the use of the corrected look-up table; in the case where the colors of the printing paper for the printing press and a printing paper for the proof press are different from each other to such an extent as to need to take the ink transmittance into account, the step of correcting the look-up table includes the step of: determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci'=Ci+Ca\times(1-Cid/(2^N-1)\times Mid/(2^N-1)\times Yid/(2^N-1)\times Bkid/(2^N-1));$$

$$Mi'=Mi+Ma\times(1-Cid/(2^N-1)\times Mid/(2^N-1)\times Yid/(2^N-1)) Bkid/(2^N-1)$$

$$Yi'=Yi+Ya\times(1-Cid/(2^N-1)\times Mid/(2^N-1)\times Yid/(2^N-1)\times Bkid/(2^N-1)); \text{ and}$$

$$Bki'=Bki+Bka\times(1-Cid/(2^N-1)\times Mid/(2^N-1)\times Yid/(2^N-1)\times Bkid/(2^N-1));$$

to thus replace the color values of the reference data with the corrected values.

According to a preferred embodiment of the above-mentioned first to third inventions, the step of creating the proof print includes the step of: changing image data converted by using the corrected look-up table based on the previously determined noise strength and distribution amount indicating the level of a variation of the color of the printing paper for the printing press, to thus make the proof print by the use of the changed image data.

Furthermore, in order to solve the above-described problems, according to the present invention, there is provided a color proofing method for improving the color reproducibility of printed matter to be produced by a printing press in proof print produced by a proof press, the color proofing method comprising the step of: correcting proof printing image data, in which each of levels of monochromatic color gradation of black on the printed matter is represented on the proof print, out of the proof printing image data over the entire color space in a subtractive process resulting from color matching between proof print produced by the proof press and the printed matter to be produced by the printing press in such a manner that a part having a black ink area factor of 100% on the printed matter is represented only with black ink also on the proof print, but that a part other than the part having a black ink area factor of 100% on the printed matter is represented on the proof print by using under color removal, to thus reproduce, on the proof print, the representing characteristics of the black ink on the printed matter.

According to a preferred embodiment of the above-mentioned fourth invention, the step of correcting the proof printing image data includes the steps of: finding $\min(C_{100}, M_{100}, Y_{100})$ from color values $(C_{100}, M_{100}, Y_{100}, Bk_{100})$ of the proof printing image data for representing, on the proof print, the part having the black ink area factor of 100% on the printed matter, to thus determine a new value P of $Bk_{100}$; finding an addition value $\alpha_{100}$ for $Bk_{100}$ in accordance with the following equation:

$$\alpha=\min(C_{100}, M_{100}, Y_{100})\times(P-Bk_{100})/\min(C_{100}, M_{100}, Y_{100}), \text{ wherein } 1\leq P\leq 100;$$

adding the addition value $\alpha_{100}$ to $Bk_{100}$ as well as setting all of $C_{100}$, $M_{100}$ and $Y_{100}$ to 0; and repeating, with respect to n from 99 to 1, the following steps of: determining $\min(C_n, M_n, Y_n)$ from color values $(C_n, M_n, Y_n, Bk_n)$ of the proof printing image data for representing, on the proof print, a part having a black ink area factor of n% on the printed matter; determining an addition value $\alpha_n$ with respect to $Bk_n$ in accordance with the following equation:

$$\alpha_n=(\min(C_n, M_n, Y_n)\times(100-n))\times(P-Bk_{100})/\min(C_{100}, M_{100}, Y_{100}),$$

wherein $1\leq P\leq 100$, to thus add the addition value $\alpha_n$ to $Bk_n$; and obtaining respective reduction values $\beta_n$, $\gamma_n$ and $\delta_n$ of $C_n$, $M_n$ and $Y_n$ in accordance with the following equations:

$$\beta_n=\alpha_n\times((P-Bk_{100})/C_{100}),$$

$$\gamma_n=\alpha_n\times((P-Bk_{100})/M_{100}), \text{ and}$$

$$\delta_n=\alpha_n\times((P-Bk_{100})/Y_{100})$$

wherein $1\leq P\leq 100$, to thus subtract the reduction values $\beta_n$, $\gamma_n$ and $\delta_n$ of $C_n$, $M_n$ and $Y_n$, respectively.

Additionally, in order to solve the above-described problems, according to the present invention, there is provided a color proofing apparatus for improving the color reproducibility of printed matter to be produced by a printing press in proof print produced by a proof press by the use of a computer, the color proofing apparatus comprising: a look-up table creating section for creating a look-up table including converted values of image data over the entire color space with respect to the proof press; a noise strength and distribution amount input section for setting the noise strength and distribution amount indicating the level of a variation of the color of the printing paper for the printing press; a paper color input section for specifying the color of the printing paper for the printing press; a look-up table correcting section for correcting the look-up table based on the color inputted to the paper color input section and a paper exposed area factor in the proof print; an image data converting section for changing the image data converted by the use of the look-up table corrected by the look-up table correcting section based on the noise strength and distribution amount inputted to the noise strength and distribution amount input section, to thus output the changed image data; in the case where the proof print is produced based on only area gradation and the colors of the printing paper for the printing press and a printing paper for the proof press are approximated to each other to such an extent as not to need to take the ink transmittance into account, the look-up table correcting section includes: a paper exposed area factor calculating section for determining a paper exposed area factor $\alpha$ in accordance with the following equation when arbitrary reference data P in the look-up table has color values (Cp, Mp, Yp, Bkp), each of which is N-bit data:

$$\alpha=(1-Cp/(2^N-1))\times(1-Mp/(2^N-1,))\times(1-Yp/(2^N-1))\times(1-Bkp/(2^N-1)),$$

in contrast, determining the paper exposed area factor $\alpha$ in accordance with the following equation when the arbitrary reference data P in the look-up table has the color values (Cp, Mp, Yp, Bkp), each of which is percentage data:

$$\alpha=(1-Cp/100)\times(1-Mp/100)\times(1-Yp/100)\times(1-Bkp/100);$$

and a color corrected value calculating section for determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci'=Ci+Ca\times\alpha,\ Mi'=Mi+Ma\times\alpha,\ Yi'=Yi+Ya\times\alpha\ \text{and}\ Bki'=Bki+Bka\times\alpha,$$

to thus replace the color values of the reference data with the corrected values.

Furthermore, in order to solve the above-described problems, according to the present invention, there is provided a color proofing apparatus for improving the color reproducibility of printed matter to be produced by a printing press in proof print produced by a proof press by the use of a computer, the color proofing apparatus comprising: a look-up table creating section for creating a look-up table including converted values of image data over the entire color space with respect to the proof press; a noise strength and distribution amount input section for setting the noise strength and distribution amount indicating the level of a variation of the color of the printing paper for the printing press; a paper color input section for specifying the color of the printing paper for the printing press; a look-up table correcting section for correcting the look-up table based on the color inputted to the paper color input section and a paper exposed area factor in the proof print and an image data converting section for changing the image data converted by the use of the look-up table corrected by the look-up table correcting section based on the noise strength and distribution amount inputted to the noise strength and distribution amount input section, to thus output the changed image data; in the case where the proof print is produced based on both of density gradation and area gradation and the colors of the printing paper for the printing press and a printing paper for the proof press are approximated to each other to such an extent as not to need to take the ink transmittance into account, the look-up table correcting section includes: an influence range input section for specifying an influence range defining how far reference data is influenced in the color space when the color values of the printing paper for the printing press are added to the color space; and an influence value calculating section for determining an influence value for each of the reference data based on the color values of the paper and the value of the influence range, to thus add the influence value to the reference data.

Furthermore, in order to solve the above-described problems, according to the present invention, there is provided a color proofing apparatus for improving the color reproducibility of printed matter to be produced by a printing press in proof print produced by a proof press by the use of a computer, the color proofing apparatus comprising: a look-up table creating section for creating a look-up table including converted values of image data over the entire color space with respect to the proof press; a noise strength and distribution amount input section for setting the noise strength and distribution amount indicating the level of a variation of the color of the printing paper for the printing press; a paper color input section for specifying the color of the printing paper for the printing press; a look-up table correcting section for correcting the look-up table based on the color inputted to the paper color input section and a paper exposed area factor in the proof print and an image data converting section for changing the image data converted by the use of the look-up table corrected by the look-up table correcting section based on the noise strength and distribution amount inputted to the noise strength and distribution amount input section, to thus output the changed image data; in the case where the colors of the printing paper for the printing press and a printing paper for the proof press are different from each other to such an extent as to need to take the ink transmittance into account, the look up table correcting section includes: a second color corrected value calculating section for determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci'=Ci+Ca\times(1-Cid/(2^N-1)\times Mid/(2^N-1)\times Yid/(2^N-1)\times Bkid/(2^N-1));$$

$$Mi'=Mi+Ma\times(1-Cid/(2^N-1)\times Mid/(2^N-1)\times Yid/(2^N-1)\times Bkid/(2^N-1));$$

$$Yi'=Yi+Ya\times(1-Cid/(2^N-1)\times Mid/(2^N-1)\times Yid/(2^N-1)\times Bkid/(2^N-1));$$

and $$Bki'=Bki+Bka\times(1-Cid/(2^N-1)\times Mid/(2^N-1)\times Yid/(2^N-1)\times Bkid/(2^N-1));$$

to thus replace the color values of the reference data with the corrected values.

Furthermore, in order to solve the above-described problems, according to the present invention, there is provided a color proofing apparatus for improving the color reproducibility of printed matter to be produced by a printing press in proof print produced by a proof press by the use of a computer, the color proofing apparatus comprising: an image data input section for receiving an input of proof printing image data over the entire color space in a subtractive process resulting from color matching between proof print produced by the proof press and the printed matter produced by the printing press; and an image data correcting section for correcting the proof printing image data, in which each of levels of monochromatic color gradation of black on the printed matter is represented on the proof print, out of the image data inputted to the image data input section in such a manner that a part having a black ink area factor of 100% on the printed matter is represented only with black ink also on the proof print, but that a part other than the part having a black ink area factor of 100% on the printed matter is represented on the proof print by using under color removal, to thus output the corrected image data.

According to a preferred embodiment of the above-mentioned eighth invention, the image data correcting section includes: a 100% black part image data correcting section for determining min ($C_{100}$, $N_{100}$, $Y_{100}$) from color values ($C_{100}$, $M_{100}$, $Y_{100}$, $Bk_{100}$) of the proof printing image data for representing, on the proof print, the part having the black ink area factor of 100% on the printed matter, to thus determine a new value P of $Bk_{100}$, determining an addition value $\alpha_{100}$ for $Bk_{100}$ in accordance with the following equation:

$$\alpha_{100}=\min(C_{100},\ M_{100},\ Y_{100})\times(P-Bk_{100})/\min(C_{100},\ M_{100},\ Y_{100}),$$

wherein $1\leq P\leq 100$ and then, adding the addition value $\alpha_{100}$ to $Bk_{100}$ as well as setting all of $C_{100}$, $M_{100}$ and $Y_{100}$ to 0; and a 99% or less black part image data correcting section for repeating, with respect to n from 99 to 1, the following processes of: determining $\min(C_n, M_n, Y_n)$ from color values $(C_n, M_n, Y_n, Bk_n)$ of the proof printing image data for representing, on the proof print, a part having a black ink area factor of n% on the printed matter; determining an addition value $\alpha_n$ for $Bk_n$ in accordance with the following equation:

$$\alpha_n = (\min(C_n, M_n, Y_n) - (100-n)) \times (P-Bk_{100})/\min(C_{100}, M_{100}, Y_{100}),$$

wherein $1 \leq P \leq 100$, to thus add the addition value $\alpha_n$ to $Bk_n$; and determining respective reduction values $\beta_n$, $\gamma_n$, and $\delta_n$, of $C_n$, $M_n$, and $Y_n$, in accordance with the following equations:

$$\beta = \alpha_n \times ((P-Bk_{100})/C_{100}),$$

$$\gamma = \alpha_n \times ((P-Bk_{100})/M_{100}), \text{ and}$$

$$\delta = \alpha_n \times ((P-Bk_{100})/Y_{100}),$$

wherein $1 \leq P \leq 100$, to thus subtract the reduction values $\beta_n$, $\gamma_n$ and $\delta_n$ from $C_n$, $M_n$ and $Y_n$, respectively.

Furthermore, in order to solve the above-described problems, according to the present invention, there is provided a recorded medium recording therein a color proofing program for improving the color reproducibility of printed matter to be produced by a printing press in proof print produced by a proof press by the use of a computer, the color proofing program instructing the computer to execute the processes of: creating a look-up table containing converted values of image data over the entire color space with respect to the proof press; correcting the look-up table based on the color of printing paper for the printing press and a paper exposed area factor in the proof print; creating proof print by the use of the corrected look-up table; in the case where the proof print is produced based on only area gradation and the colors of the printing paper for the printing press and a printing paper for the proof press are approximated to each other to such an extent as not to need to take the ink transmittance into account, the look-up table correcting process includes the processes of: determining a paper exposed area factor $\alpha$ in accordance with the following equation when arbitrary reference data P in the look-up table has color values (Cp, Mp, Yp, Bkp), each of which is N-bit data:

$$\alpha = (1-Cp/(2^N-1)) \times (1-Mp/(2^N-1)) \times (1-Yp/(2^N-1)) \times (1-Bkp/(2^N-1)),$$

in contrast, determining the paper exposed area factor $\alpha$ in accordance with the following equation when the arbitrary reference data P in the look-up table has the color values (Cp, Mp, Yp, Bkp), each of which is percentage data:

$$\alpha = (1-Cp/100) \times (1-Mp/100) \times (1-Yp/100) \times (1-Bkp/100);$$

and determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci' = Ci + Ca \times \alpha, \; Mi' = Mi + Ma \times \alpha, \; Yi' = Yi + Ya \times \alpha \text{ and } Bki' = Bki + Bka \times \alpha,$$

to thus replace the color values of the reference data with the corrected values.

In addition, in order to solve the above-described problems, according to the present invention, there is provided a recorded medium recording therein a color proofing program for improving the color reproducibility of printed matter to be produced by a printing press in proof print produced by a proof press by the use of a computer, the color proofing program instructing the computer to execute the processes of: creating a look-up table containing converted values of image data over the entire color space with respect to the proof press; correcting the look-up table based on the color of printing paper for the printing press and a paper exposed area factor in the proof print; creating proof print by the use of the corrected look-up table; in the case where the proof print is produced based on both of density gradation and area gradation and the colors of the printing paper for the printing press and a printing paper for the proof press are approximated to each other to such an extent as not to need to take the ink transmittance into account, the look-up table correcting process includes the processes of: specifying an influence range defining how far reference data is influenced in the color space when the color values of the printing paper for the printing press are added to the color space; and determining an influence value for each of the reference data based on the color values of the paper and the value of the influence range, to thus add the influence value to the reference data.

Moreover, in order to solve the above-described problems, according to the present invention, there is provided a recorded medium recording therein a color proofing program for improving the color reproducibility of printed matter to be produced by a printing press in proof print produced by a proof press by the use of a computer, the color proofing program instructing the computer to execute the processes of: creating a look-up table containing converted values of image data over the entire color space with respect to the proof press; correcting the look-up table based on the color of printing paper for the printing press and a paper exposed area factor in the proof print; creating proof print by the use of the corrected look-up table; in the case where the colors of the printing paper for the printing press and a printing paper for the proof press are different from each other to such an extent as to need to take the ink transmittance into account, the look-up table correcting process includes the processes of: determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci' = Ci + Ca \times (1-Cid/(2^N-1) \times Mid/(2^N-1) \times Yid/(2^N-1) \times Bkid/(2^N-1));$$

$$Mi' = Mi + Ma \times (1-Cid/(2^N-1) \times Mid/(2^N-1) \times Yid/(2^N-1) \times Bkid/(2^N-1));$$

$$Yi' = Yi + Ya \times (1-Cid/(2^N-1) \times Mid/(2^N-1) \times Yid/(2^N-1) \times Bkid/(2^N-1));$$

and $$Bki' = Bki + Bka \times (1-Cid/(2^N-1) \times Mid/(2^N-1) \times Yid/(2^N-1) \times Bkid/(2^N-1));$$

to thus replace the color values of the reference data with the corrected values.

According to a preferred embodiment of the above-mentioned ninth to eleventh invention, the proof print creating process includes the process of: changing image data converted by using the corrected look-up table based on the previously determined noise strength and distribution amount indicating the level of a variation of the color of the printing paper for the printing press, to thus create the proof print by the use of the changed image data.

Furthermore, in order to solve the above-described problems, according to the present invention, there is provided a recording medium recording therein the color proofing program for improving the color reproducibility of printed matter to be produced by a printing press in proof print produced by a proof press by the use of a computer, the color proofing program further instructing the computer to execute the process of: correcting proof printing image data, in which each of levels of monochromatic color gradation of black on the printed matter is represented on the proof print, out of the proof printing image data over the entire color space in a subtractive process resulting from color matching between proof print by the proof press and the printed matter by means of the printing press in such a manner that a part having a black ink area factor of 100% on the printed matter is represented only with black ink also on the proof print, but that a part other than the part having a black ink area factor of 100% on the printed matter is represented on the proof print by using under color removal, to thus reproduce, on the proof print, the representing characteristics of the black ink on the printed matter.

According to a preferred embodiment of the above-mentioned twelfth invention, the proof printing image data correcting process includes the processes of: determining $\min(C_{100}, M_{100}, Y_{100})$ from color values $(C_{100}, M_{100}, Y_{100}, Bk_{100})$ of the proof printing image data for representing, on the proof print, the part having the black ink area factor of 100% on the printed matter, to thus determine a new value P of $Bk_{100}$; determining an addition value $\alpha_{100}$ for $Bk_{100}$ in accordance with the following equation:

$$\alpha_{100} = \min(C_{100}, M_{100}, Y_{100}) \times (P - Bk_{100})/\min(C_{100}, M_{100}, Y_{100}),$$

wherein $1 \leq P \leq 100$; adding the addition value $\alpha_{100}$ to $Bk_{100}$ as well as setting all of $C_{100}$, $M_{100}$ and $Y_{100}$ to 0; and repeating, with respect to n from 99 to 1, the following steps of: determining $\min(C_n, M_n, Y_n)$ from color values $(C_n, M_n, Y_n, Bk_n)$ of the proof printing image data for representing, on the proof print, a part having a black ink area factor of n% on the printed matter; determining an addition value $\alpha_n$ with respect to $Bk_n$ in accordance with the following equation:

$$\alpha_n = (\min(C_n, M_n, Y_n) - (100-n)) \times (P - Bk_{100})/\min(C_{100}, M_{100}, Y_{100}),$$

wherein $1 \leq P \leq 100$, to thus add the addition value $\alpha_n$ to $Bk_n$; and determining respective reduction values $\beta_n, \gamma_n$ and $\delta_n$, of $C_n$, $M_n$, and $Y_n$ in accordance with the following equations:

$$\beta_n = \alpha_n \times ((P - Bk_{100})/C_{100}),$$

$$\gamma_n = \alpha_n \times ((P - Bk_{100})/M_{100}), \text{ and}$$

$$\delta_n = \alpha_n \times ((P - Bk_{100})/Y_{100}),$$

wherein $1 \leq P \leq 100$, to thus subtract the reduction values $\beta_n$, $\gamma_n$ and $\delta_n$, from $C_n$, $M_n$, and $Y_n$, respectively.

BEST MODE CARRYING OUT THE INVENTION

Figure 1:
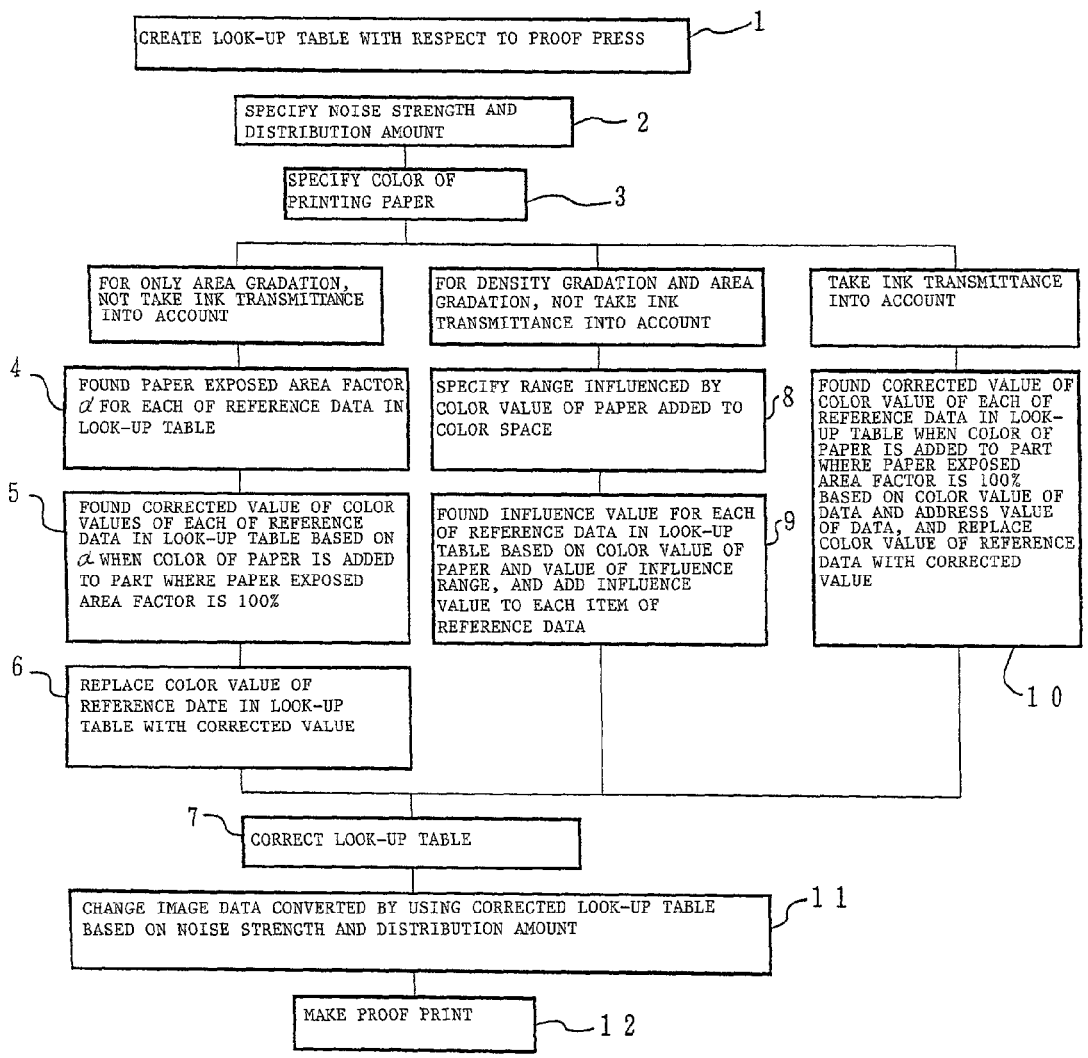
FIG. 1 is a flowchart illustrating the schematic configuration of a color proofing method according to a preferred embodiment in the present invention.

A preferred embodiment of the present invention will be described hereinafter with reference to the accompanying drawings. FIG. 1 is a flowchart illustrating the schematic configuration of a color proofing method according to a preferred embodiment of the present invention. Referring to FIG. 1, first, an luook-up table including corrected values of image data over the entire color space is created with respect to a proof press, for example, a color printing press (see Step (1) in FIG. 1). Subsequently, the noise strength and distribution amount indicating the level of a variation of the color of a printing paper (a printing paper) for the proof press is specified (see Step (2) in FIG. 1), and then, the color of the printing paper is specified (see Step (3) in FIG. 1).

Like in offset lithography, in the case where the proof print is created in a printing system for performing only area gradation and the colors of the printing paper and a printing paper for the proof press are approximated to each other to such an extent as not to need to take the ink transmittance into account, when arbitrary reference data P in the look-up table has color values (Cp, Mp, Yp, Bkp), each of which is 8-bit data, a paper exposed area factor a is determined in accordance with the following equation:

$$\alpha = (1 - Cp/255) \times (1 - Mp/255) \times (1 - Yp/255) \times (1 - Bkp/255)$$

(see Step (4) in FIG. 1).

When the color values of the reference data are expressed by the percentage, the paper exposed area factor a is determined in accordance with the following equation:

$$\alpha = (1 - Cp/100) \times (1 - Mp/100) \times (1 - Yp/100) \times (1 - Bkp/100).$$

Thereafter, corrected values (Ci', Mi', Yi', Bki') of color values (Ci, Mi, Yi, Bki) of arbitrary reference data I in the look-up table when color values (Ca, Ma, Ya, Bka) of the printing paper are added to a part where a paper exposed area factor is 100% are obtained in accordance with the following equations:

$$Ci' = Ci + Ca \times \alpha, \; Mi' = Mi + Ma \times \alpha, \; Yi' = Yi + Ya \times \alpha \text{ and}$$
$$Bki' = Bki + Bka \times \alpha$$

(see Step (5) in FIG. 1), to replace the color values of the reference data with the corrected values (see Step (6) in FIG. 1), thus correcting the look-up table (see Step (7) in FIG. 1).

Here, in the case of actually excellent printed matter, dot gain characteristics obtained by the Murray-Davies system or the Yule-Nielsen system are represented by a curve which is expanded at a halftone part by about 10% to 20%. Consequently, similar curve characteristics are given with respect to a paper color effect rate, resulting in color reproducibility approximate to the dot gain characteristics obtained by the Murray-Davies system or the Yule-Nielsen system.

Like in gravure printing, in the case where the proof print is created in a printing system for performing both of density gradation and area gradation and the colors of the printing paper and a printing paper for the proof press are approximated to each other to such an extent as not to need to take the ink transmittance into account, an influence range defining how far reference data is influenced in the color space is specified when the color values of the printing paper are added to the color space (see Step (8) in FIG. 1), an influence value for each of the reference data is obtained based on the color values of the paper and the value of the influence range (see Step (9) in FIG. 1). The influence value is added to the reference data, thus correcting the look-up table (see Step (7) in FIG. 1).

Now, explanation will be made on a method for deriving the influence range and the influence value. It is assumed that the color value (Ca, Ma, Ya, Bka) of the printing paper has linear or curve characteristics over the entire color space or within a predetermined influence range, and has an effect on each of the reference data in the look-up table. Here, an influence value (Cieff, Mieff, Yieff, Bkieff) in the case where the color value (Ca, Ma, Ya, Bka) of the paper linearly has an effect on the color value (Ci, Mi, Yi, Bki) of arbitrary reference data I is obtained as described below.

First, the paper color effect rate in the reference data I is set to be equal to a ratio of a distance from the coordinate (x=0, y=0, z=0, w=0) at a point Q where the paper color value over the entire color space is introduced, to the coordinate of the reference data I. Assuming that the coordinate of the reference data I is represented by $(x_i, y_i, z_i, w_i)$, the distance D between the point Q and the reference data I is defined in accordance with the following equation:

$$D=\max(|x_i-0|, |y_i-0|, |z_i-0|, |w_i-0|)$$

wherein, max(a, b, c) signifies a maximum value taken out of a, b and c.

The influence values with respect to the reference value I are expressed as follows:

$$Cieff=Ca\times(255\times D)/255$$

$$Mieff=Ma\times(255\times D)/255$$

$$Yieff=Ya\times(255\times D)/255$$

$$Bkieff=Bka\times(255\times D)/255$$

Here, each of the values is 8-bit data. Incidentally, when each of the values is expressed in the percentage, the influence values with respect to the reference value I are expressed as follows:

$$Cieff=Ca\times(100\times D)/100$$

$$Mieff=Ma\times(100\times D)/100$$

$$Yieff=Ya\times(100\times D)/100$$

$$Bkieff=Bka\times(100\times D)/100$$

In the case where the colors of the printing paper and a printing paper for the proof press are different from each other to such an extent as to need to take the ink transmittance into account, corrected values (Ci', Mi', Yi', Bki') of color values (Ci, Mi, Yi, Bki) of arbitrary reference data I in the look-up table when color values (Ca, Ma, Ya, Bka) of the printing paper are added to a part where a paper exposed area factor is 100%, wherein address values (Cid, Mid, Yid, Bkid) express the color values (Ci, Mi, Yi, Bki) by N-bit are determined in accordance with the following equations:

$$Ci'=Ci+Ca\times(1-Cid/(2^N-1)\times Mid/(2^N-1)\times Yid/(2^N-1)\times Bkid/(2^N-1));$$

$$Mi'=Mi+Ma\times(1-Cid/(2^N-1)\times Mid/(2^N-1)\times Yid/(2^N-1)\times Bkid/(2^N-1));$$

$$Yi'=Yi+Ya\times(1-Cid/(2^N-1)\times Mid/(2^N-1)\times Yid/(2^N-1)\times Bkid/(2^N-1));$$

and $$Bki'=Bki+Bka\times(1-Cid/(2^N-1)\times Mid/(2^N-1)\times Yid/(2^N-1)\times Bkid/(2^N-1));$$

to thus replace the color values of the reference data with the corrected values (see Step (10) in FIG. 1).

Image data converted by using the look-up table corrected in the above-described manner is changed based on the noise strength and distribution amount (see Step (11) in FIG. 1). The proof print is created based on the changed image data by the color printing press (see Step (12) in FIG. 1)

Also in this case, although no optical dot gain value is taken into consideration when the paper color effect rate is linearly taken, the object can be sufficiently achieved by deriving an effect rate added with appropriate curve characteristics.

The color of the printing paper can be reproduced on the formed proof print with accuracy.

Figure 2:
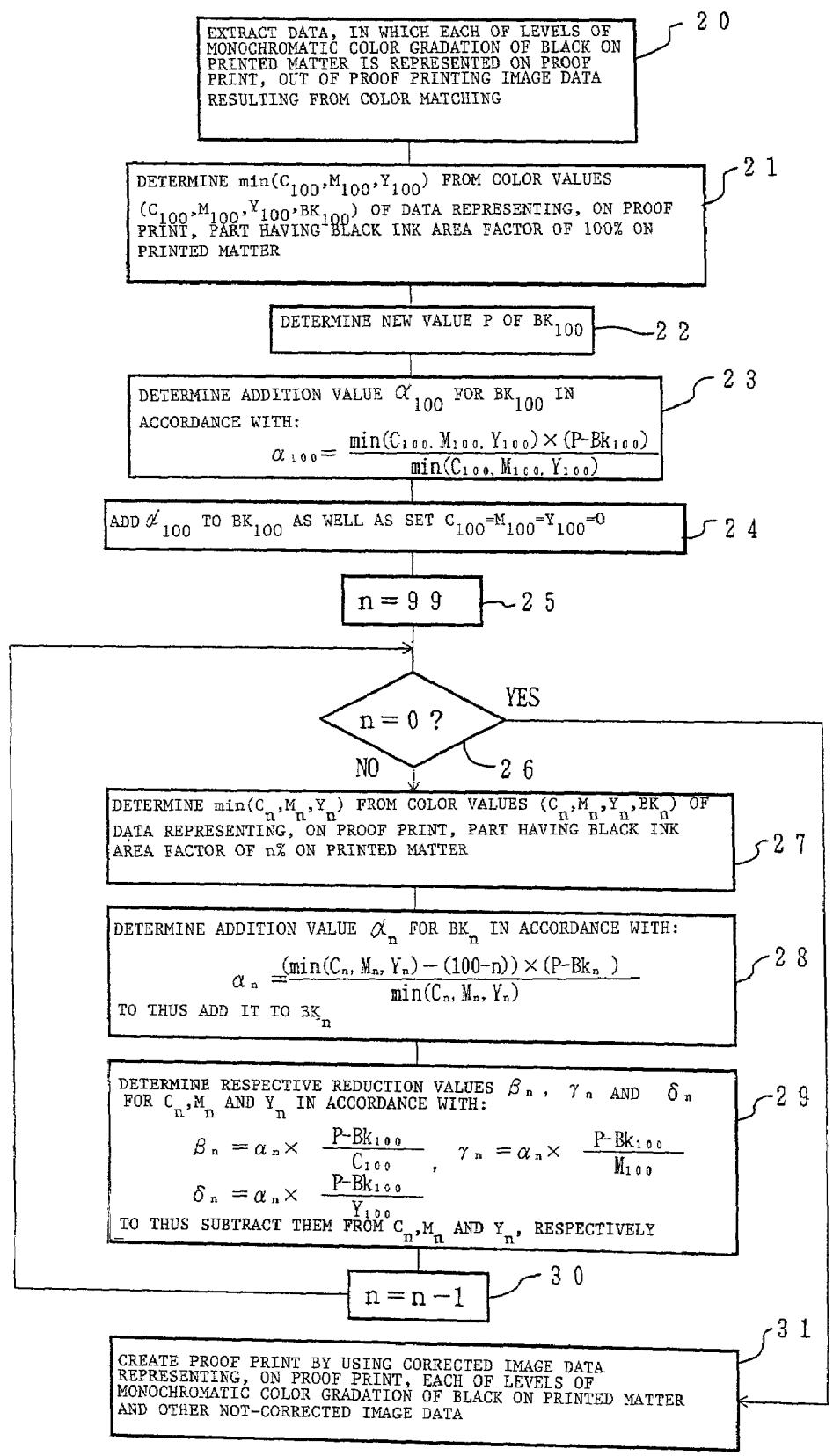
FIG. 2 is a flowchart illustrating the schematic configuration of a color proofing method according to another preferred embodiment in the present invention.

FIG. 2 is a flowchart illustrating the schematic configuration of a color proofing method according to another preferred embodiment in the present invention. Referring to FIG. 2, first, proof printing image data, in which each of levels of monochromatic color gradation of black on printed matter is represented on proof print, is extracted out of the proof printing image data over the entire color space in a subtractive process resulting from color matching between the proof print by the proof press and the printed matter by means of the printing press (see Step (20) in FIG. 2).

And then, $\min(C_{100}, M_{100}, Y_{100})$ is obtained from color values $(C_{100}, M_{100}, Y_{100}, Bk_{100})$ of the proof printing image data for representing, on the proof print, the part having the black ink area factor of 100% on the printed matter (see Step (21) in FIG. 2), and then, a new value P of $Bk_{100}$ is determined (see Step (22) in FIG. 2). Thereafter, an addition value $\alpha_{100}$ for $Bk_{100}$ is obtained in accordance with the following equation:

$$\alpha_{100}=\min(C_{100}, M_{100}, Y_{100})\times(P-Bk_{100})/\min(C_{100}, M_{100}, Y_{100}),$$

wherein $1 \leq P \leq 100$ (see Step (23) in FIG. 2). Subsequently, the addition value $\alpha_{100}$ is added to $Bk_{100}$, and further, all of $C_{100}$, $M_{100}$ and $Y_{100}$ are set to 0 (see Step (24) in FIG. 2).

Furthermore, with respect to n from 99 to 1, processes (a) to (c) described below are repeated (see Steps (25) to (30) in FIG. 2).

(a) $\min(C_n, M_n, Y_n)$ is obtained from color values $(C_n, M_n, Y_n, Bk_n)$ of the proof printing image data for representing, on the proof print, a part having a black ink area factor of n% on the printed matter (see Step (27) in FIG. 2);

(b) an addition value $\alpha_n$ for $Bk_n$ is determined in accordance with the following equation:

$$\alpha_n=(\min(C_n, M_n, Y_n)-(100-n))\times(P-Bk_{100})/\min(C_{100}, M_{100}, Y_{100}),$$

wherein $1 \leq P \leq 100$, to thus add the addition value $\alpha_n$ to $Bk_n$ (see Step (28) in FIG. 2); and (c) respective reduction values $\beta_n$, $\gamma_n$ and $\delta_n$ of $C_n$, $M_n$, and $Y_n$ are determined in accordance with the following equations:

$$\beta_n = \alpha_n \times ((P - Bk_{100})/C_{100}),$$

$$\gamma_n = \alpha_n \times ((P - Bk_{100})/M_{100}), \text{ and}$$

$$\delta_n = \alpha_n \times ((P - Bk_{100})/Y_{100}),$$

wherein $1 \leq P \leq 100$, to thus subtract the reduction values $\beta_n$, $\gamma_n$ and $\delta_n$ from $C_n$, $M_n$ and $Y_n$, respectively (see Step (29) in FIG. 2).

The proofing is performed by the color printing press based on the proof printing image data which is corrected in the above-described manner and in which each of levels of monochromatic color gradation of black on the printed matter is represented on the proof print and the other not-corrected proof printing image data (see Step (31) in FIG. 2).

On the obtained proof print is reproduced a part having an area factor of 100% of the black ink used much in representing an Indian ink character or the like on the printed matter. In this manner, the representing characteristics of the black ink on the printed matter can be reproduced with accuracy. Moreover, the black ink is used as much as possible on the proof print, so that the use amount of ink C, M or Y can be reduced, thereby saving the cost of the proofing.

If a color proofing program for instructing a computer to execute the color proofing method according to the present invention is recorded in a recording medium such as a flexible disk or a CD-ROM, the computer reads the recording medium, thereby readily carrying out the color proofing method according to the present invention.

Figure 3:
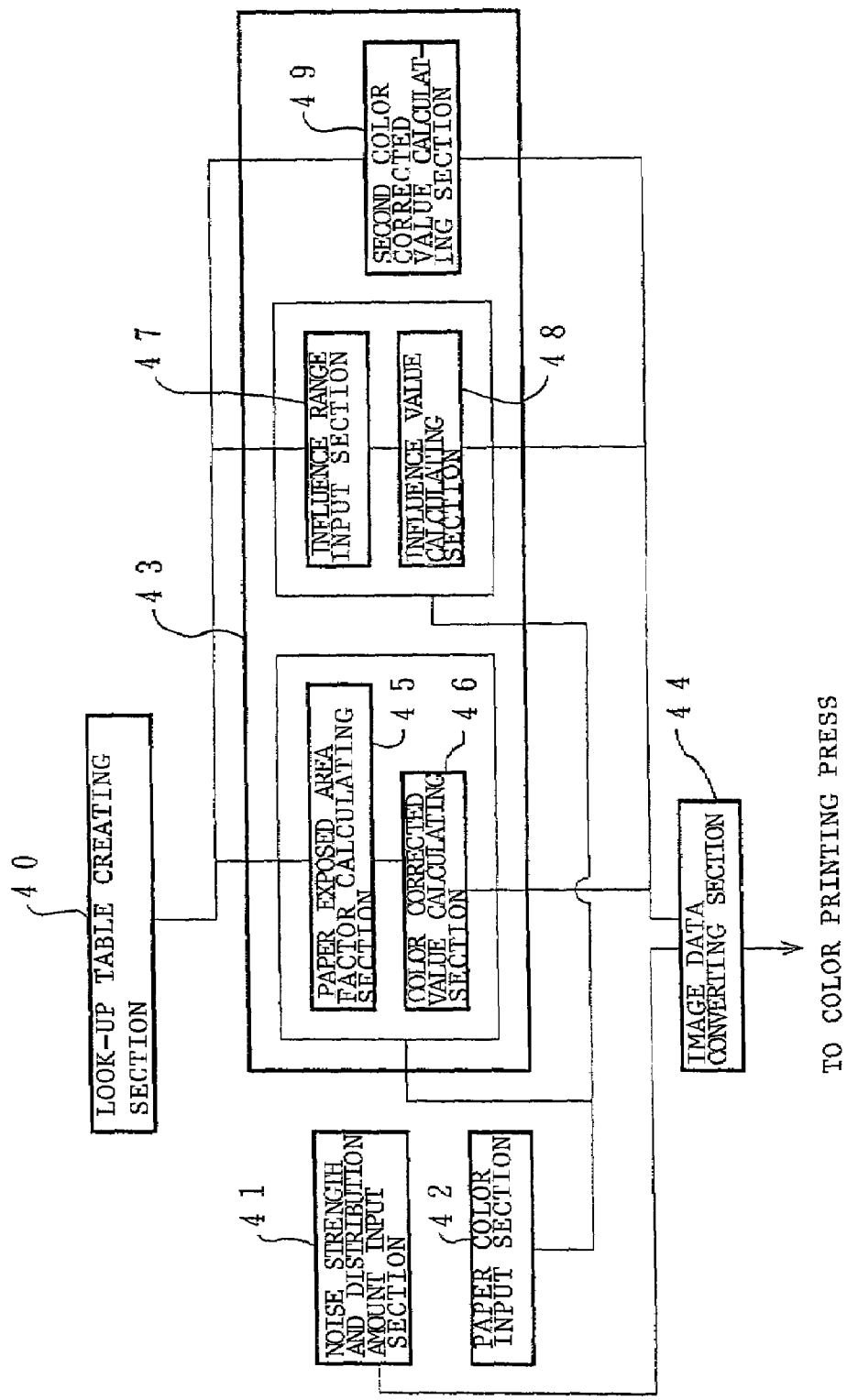
FIG. 3 is a block diagram illustrating the schematic configuration of a color proofing apparatus according to a preferred embodiment in the present invention.

FIG. 3 is a block diagram illustrating the schematic configuration of a color proofing apparatus according to a preferred embodiment in the present invention. The color proofing apparatus according to the present invention is adapted to improve the color reproducibility of printed matter by a printing press in proofing by a proof press by the use of a computer. As illustrated in FIG. 3, the color proofing apparatus according to the present invention comprises: a look-up table creating section 40 for creating a look-up table including converted values of image data over the entire color space with respect to the proof press; a noise strength and distribution amount input section 41 for setting the noise strength and distribution amount indicating the level of a variation of the color of a printing paper for the printing press (a printing paper); and a paper color input section 42 for specifying the color of the printing paper for the printing press. The color proofing apparatus further comprises: a look-up table correcting section 43 for correcting the look-up table based on the color inputted to the paper color input section 42 and a paper exposed area factor in the proof print; and an image data converting section 44 for changing the image data converted by the use of the look-up table corrected by the look-up table correcting section 43 based on the noise strength and distribution amount inputted to the noise strength and distribution amount input section 41, to thus output the changed image data.

In the case where the proof print is produced in a printing system for performing only area gradation and the colors of the printing paper and a printing paper for the proof press are approximated to each other to such an extent as not to need to take the ink transmittance into account, the look-up table correcting section 43 includes a paper exposed area factor calculating section 45 for determining a paper exposed area factor a in accordance with the following equation, when arbitrary reference data P in the look-up table has color values (Cp, Mp, Yp, Bkp), each of which is N-bit data:

$$\alpha = (1 - Cp/(2^N - 1)) \times (1 - Mp/(2^N - 1)) \times (1 - Yp/(2^N - 1)) \times (1 - Bkp/(2^N - 1)),$$

in contrast, determining the paper exposed area factor α in accordance with the following equation, when the arbitrary reference data P in the look-up table has the color values (Cp, Mp, Yp, Bkp), each of which is percentage data:

$$\alpha = (1 - Cp/100) \times (1 - Mp/100) \times (1 - Yp/100) \times (1 - Bkp/100);$$

and a color corrected value calculating section 46 for determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci' = Ci + Ca \times \alpha, \ Mi' = Mi + Ma \times \alpha, \ Yi' = Yi + Ya \times \alpha \text{ and}$$
$$Bki' = Bki + Bka \times \alpha,$$

to thus replace the color values of the reference data with the corrected values.

In the case where the proof print is produced in a printing system for performing both of density gradation and area gradation and the colors of the printing paper and a printing paper for the proof press are approximated to each other to such an extent as not to need to take the ink transmittance into account, the look-up table correcting section 43 includes an influence range input section 47 for specifying an influence range defining how far reference data is influenced in the color space when the color values of the printing paper are added to the color space; and an influence value calculating section 48 for determining an influence value for each of the reference data based on the color values of the paper and the value of the influence range, to thus add the influence value to the reference data.

In the case where the colors of the printing paper and a printing paper for the proof press are different from each other to such an extent as to need to take the ink transmittance into account, the look-up table correcting section 43 includes a second color corrected value calculating section 49 for determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit;

$$Ci'Ci + Ca \times (1 - Cid/(2^N - 1) \times Mid/(2^N - 1) \times Yid/(2^N - 1)) \times Bkid/(2^N - 1));$$

$$Mi' = Mi + Ma \times (1 - Cid/(2^N - 1) \times Mid/(2^N - 1) \times Yid/(2^N - 1) \times Bkid/(2^N - 1));$$

$$Yi' = Yi + Ya \times (1 - Cid/(2^N - 1) \times Mid/(2^N - 1) \times Yid/(2^N - 1) \times Bkid/(2^N - 1)); \text{ and}$$

$$Bki' = Bki + Bka \times (1 - Cid/(2^N - 1) \times Mid/(2^N - 1) \times Yid/(2^N - 1) \times Bkid/(2^N - 1));$$

to thus replace the color values of the reference data with the corrected values.

Figure 4:
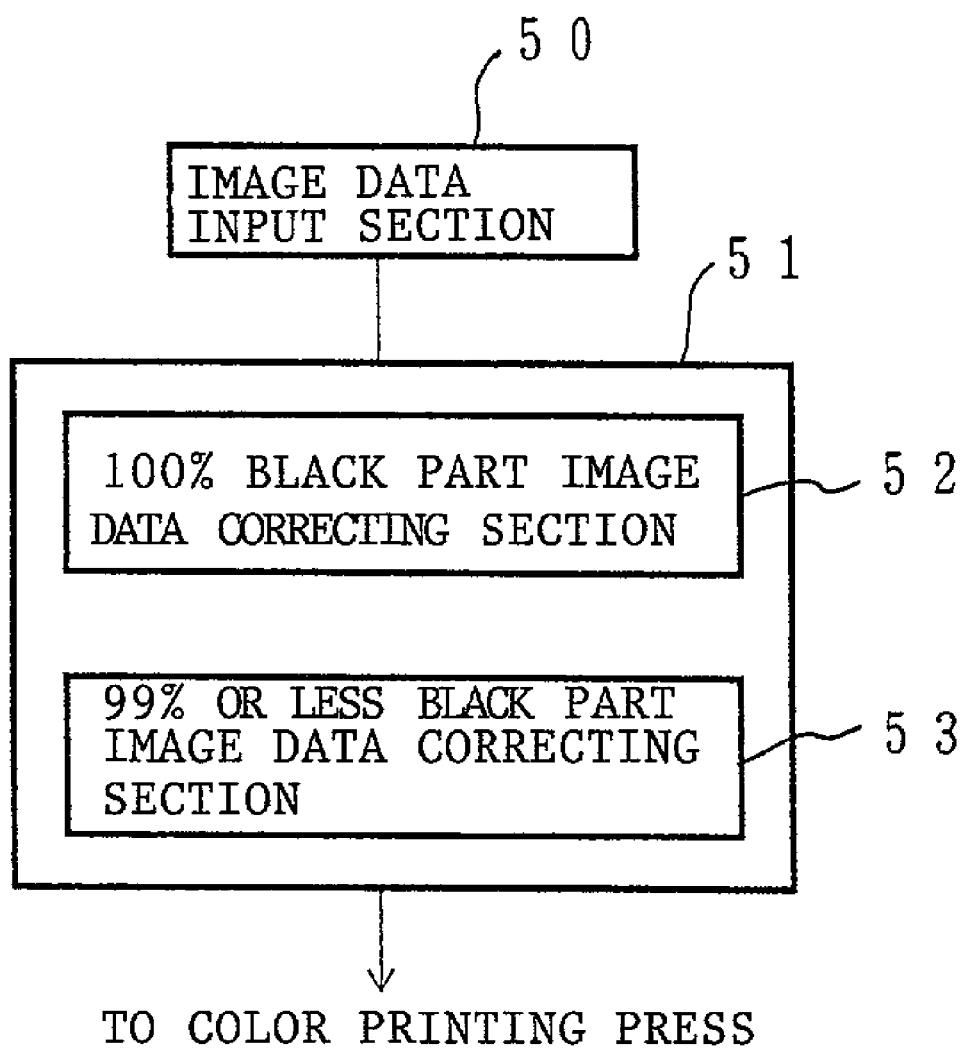
FIG. 4 is a block diagram illustrating the schematic configuration of a color proofing apparatus according to another preferred embodiment in the present invention.
Figure 5:
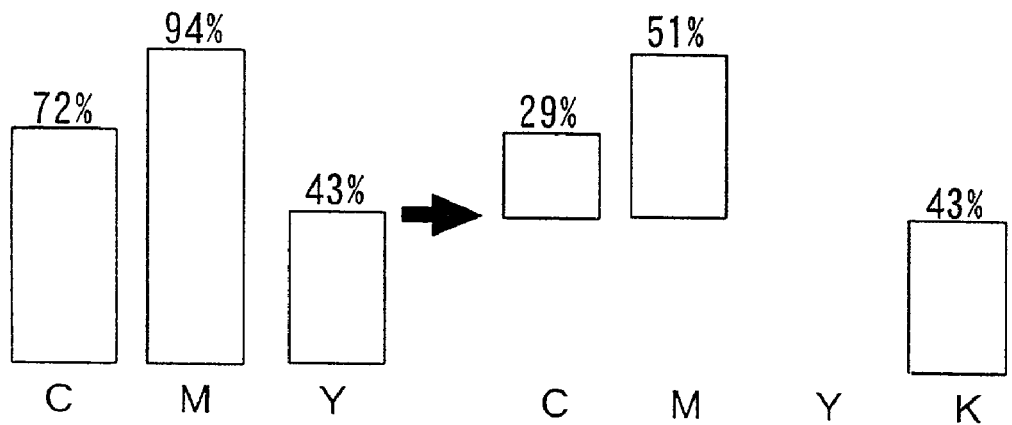
FIG. 5 is a diagram illustrating a full black method.
Figure 6:
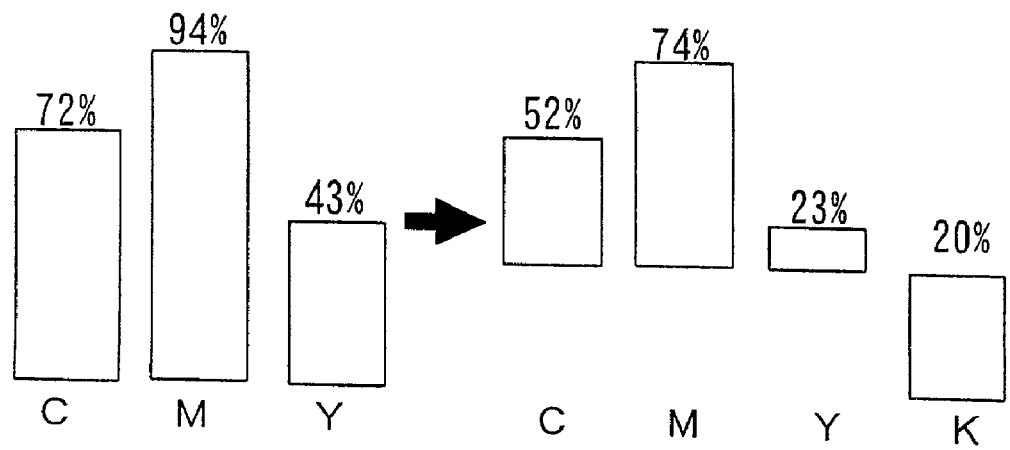
FIG. 6 is a diagram illustrating a skeleton black method.
Figure 7:
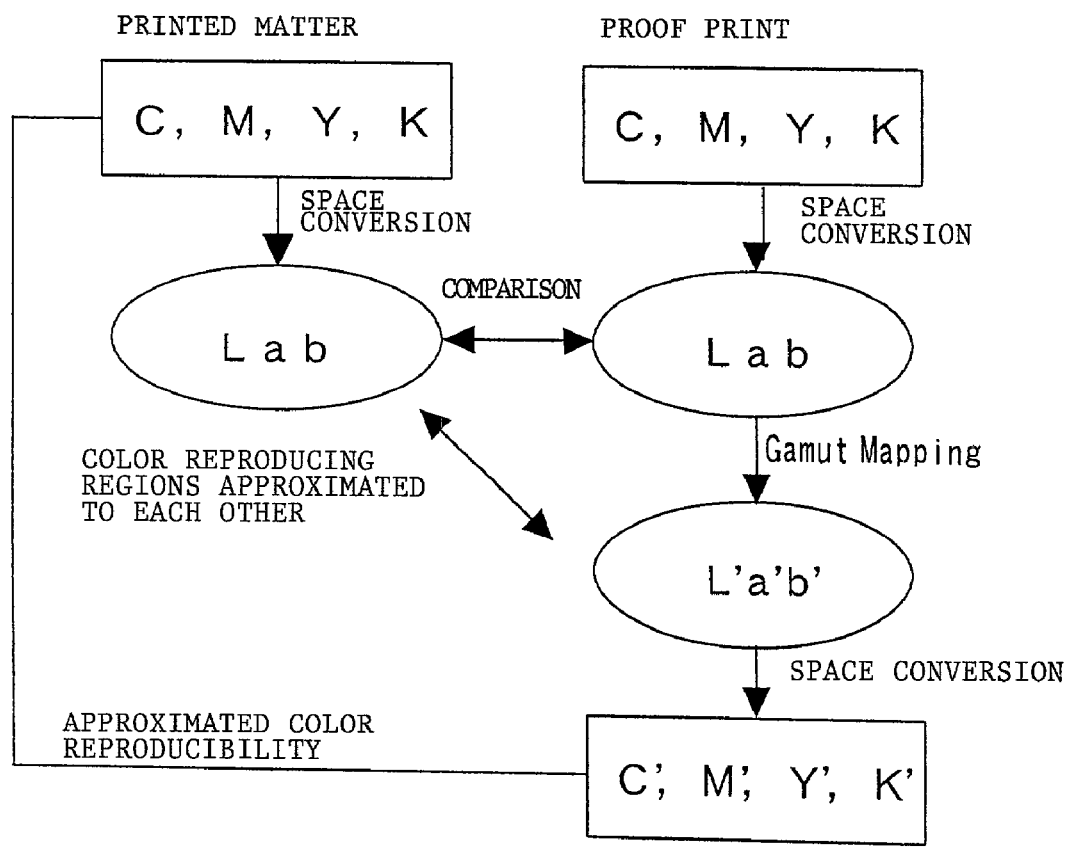
FIG. 7 is a diagram illustrating a conventional method for performing color matching between printed matter and proof print.

FIG. 4 is a block diagram illustrating the schematic configuration of a color proofing apparatus according to another preferred embodiment of the present invention. The color proofing apparatus according to the present invention is adapted to improve the color reproducibility of a printing paper in proofing by means of a proof press by the use of a computer. As illustrated in FIG. 4, the color proofing apparatus according to the present invention comprises an image data input section 50 for receiving an input of proof printing image data over the entire color space in a subtractive process resulting from color matching between proof print produced by the proof press and the printed matter to be produced by the printing press; and an image data correcting section 51 for correcting the proof printing image data, in which each of levels of monochromatic color gradation of black on the printed matter is represented on the proof print, out of the image data inputted to the image data input section 50 in such a manner that a part having a black ink area factor of 100% on the printed matter is represented only with black ink also on the proof print, but that a part other than the part having a black ink area factor of 100% on the printed matter is represented on the proof print by using under color removal, to thus output the corrected image data.

The image data correcting section 51 includes a 100% black part image data correcting section 52 for determining $\min(C_{100}, M_{100}, Y_{100})$ from color values $(C_{100}, M_{100}, Y_{100}, Bk_{100})$ of the proof printing image data for representing, on the proof print, the part having the black ink area factor of 100% on the printed matter, to thus determine a new value P of $Bk_{100}$, determining an addition value $\alpha_{100}$ for $Bk_{100}$ in accordance with the following equation:

$$\alpha_{100} = \min(C_{100}, M_{100}, Y_{100}) \times (P - Bk_{100}) / \min(C_{100}, M_{100}, Y_{100}),$$

wherein $1 \leq P \leq 100$, and then, adding the addition value $\alpha_{100}$ to $Bk_{100}$ as well as setting all of $C_{100}$, $M_{100}$ and $Y_{100}$ to 0; and a 99% or less black part image data correcting section 53 for repeating, with respect to n from 99 to 1, the following processes of determining $\min(C_n, M_n, Y_n)$ from color values $(C_n, M_n, Y_n, Bk_n)$ of the proof printing image data for representing, on the proof print, a part having a black ink area factor of n% on the printed matter; determining an addition value $\alpha_n$ for $Bk_n$ in accordance with the following equation:

$$\alpha_n = (\min(C_n, M_n, Y_n) - (100 - n)) \times (P - Bk_{100}) / \min(C_{100}, M_{100}, Y_{100}),$$

wherein $1 \leq P \leq 100$, to thus add the addition value $\alpha_n$ to $Bk_n$; and determining respective reduction values $\beta_n$, $\gamma_n$ and $\delta_n$ for $C_n$, $M_n$ and $Y_n$ in accordance with the following equations:

$$\beta_n = \alpha_n \times ((P - Bk_{100}) / C_{100}),$$

$$\gamma_n = \alpha_n \times ((P - Bk_{100}) / M_{100}), \text{ and}$$

$$\delta_n = \alpha_n \times ((P - Bk_{100}) / Y_{100}),$$

wherein $1 \leq P \leq 100$, to thus subtract the reduction values $\beta_n$, $\gamma_n$ and $\delta_n$ from $C_n$, $M_n$ and $Y_n$, respectively.

INDUSTRIAL UTILIZABILITY

As described above, according to the present invention, it is possible to readily achieve the color reproducibility of the high accuracy between the printed matter and the proof print in the color proofing. In particular, according to the present invention, it is possible to reproduce the representing characteristics of the color of the printed matter and the black ink on the printed matter with the high accuracy in the proofing. Thus, the present invention can remarkably contribute to the efficiency of the proofing work.

The invention claimed is:

1. A color proofing apparatus for improving the color reproducibility of printed matter to be produced by a printing press in proof print produced by a proof press by the use of a computer, the color proofing apparatus comprising:
   a look-up table creating section for creating a look-up table including converted values of image data over the entire color space with respect to the proof press;
   a noise strength and distribution amount input section for setting the noise strength and distribution amount indicating the level of a variation of the color of the printing paper for the printing press;
   a paper color input section for specifying the color of the printing paper for the printing press;
   a look-up table correcting section for correcting the look-up table based on the color inputted to the paper color input section and a paper exposed area factor in the proof print;
   an image data converting section for changing the image data converted by the use of the look-up table corrected by the look-up table correcting section based on the noise strength and distribution amount inputted to the noise strength and distribution amount input section, to thus output the changed image data;
   in the case where the proof print is produced based on only area gradation and the colors of the printing paper for the printing press and a printing paper for the proof press are approximated to each other to such an extent as not to need to take the ink transmittance into account, the look-up table correcting section includes:
   a paper exposed area factor calculating section for determining a paper exposed area factor $\alpha$ in accordance with the following equation when arbitrary reference data P in the look-up table has color values (Cp, Mp, Yp, Bkp), each of which is N-bit data:

$$\alpha = (1 - Cp/(2^N - 1)) \times (1 - Mp/(2^N - 1)) \times (1 - Yp/(2^N - 1)) \times (1 - Bkp/(2^N - 1)),$$

in contrast, determining the paper exposed area factor $\alpha$ in accordance with the following equation when the arbitrary reference data P in the look-up table has the color values (Cp, Mp, Yp, Bkp), each of which is percentage data:

$$\alpha = (1 - Cp/100) \times (1 - Mp/100) \times (1 - Yp/100) \times (1 - Bkp/100); \text{ and}$$

a color corrected value calculating section for determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci' = Ci + Ca \times \alpha, \; Mi' = Mi + Ma \times \alpha, \; Yi' = Yi + Ya \times \alpha, \text{ and } Bki' = Bki + Bka \times \alpha,$$

to thus replace the color values of the reference data with the corrected values.

2. A color proofing method for improving the color reproducibility of printed matter to be produced by a printing press in proof print produced by a proof press, the color proofing method comprising the steps of:
   creating a look-up table containing converted values of image data over the entire color space with respect to the proof press;

correcting the look-up table based on the color of printing paper for the printing press and a paper exposed area factor in the proof print;

making proof print by the use of the corrected look-up table;

in the case where the proof print is produced based on area gradation and the colors of the printing paper for the printing press and a printing paper for the proof press are approximated to each other to such an extent as not to need to take the ink transmittance into account, the step of correcting the look-up table includes the steps of:

determining a paper exposed area factor $\alpha$ in accordance with the following equation when arbitrary reference data P in the look-up table has color values (Cp, Mp, Yp, Bkp), each of which is N-bit data:

$$\alpha = (1-Cp/(2^N-1)) \times (1-Mp/(2^N-1)) \times (1-Yp/(2^N-1)) \times (1-Bkp/(2^N-1)),$$

in contrast, determining the paper exposed area factor $\alpha$ in accordance with the following equation when the arbitrary reference data P in the look-up table has the color values (Cp, Mp, Yp, Bkp), each of which is percentage data:

$$\alpha = (1-Cp/100) \times (1-Mp/100) \times (1-Yp/100) \times (1-Bkp/100);$$

and determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci' = Ci + Ca \times \alpha,\ Mi' = Mi + Ma \times \alpha,\ Yi' = Yi + Ya \times \alpha \text{ and } Bki' = Bki + Bka \times \alpha,$$

to thus replace the color values of the reference data with the corrected values.

3. The color proofing method according to claim 2, wherein the step of creating the proof print includes the step of:

changing image data converted by using the corrected look-up table based on the previously determined noise strength and distribution mount indicating the level of a variation of the color of the printing paper for the printing press, to thus make the proof print by the use of the changed image data.

4. A color proofing method for improving the color reproducibility of printed matter to be produced by a printing press in proof print produced by a proof press, the color proofing method comprising the steps of:

creating a look-up table containing converted values of image data over the entire color space with respect to the proof press;

correcting the look-up table based on the color of printing paper for the printing press and a paper exposed area factor in the proof print;

making proof print by the use of the corrected look-up table;

in the case where the colors of the printing paper for the printing press and a printing paper for the proof press are different from each other to such an extent as to need to take the ink transmittance into account, the step of correcting the look-up table includes the step of:

determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci' = Ci + Ca \times (1 - Cid/(2^N-1)) \times Mid/(2^N-1) \times Yid/(2^N-1) \times Bkid/(2^N-1));$$

$$Mi' = Mi + Ma \times (1 - Cid/(2^N-1)) \times Mid/(2^N-1) \times Yid/(2^N-1) \times Bkid/(2^N-1));$$

$$Yi' = Yi + Ya \times (1 - Cid/(2^N-1)) \times Mid/(2^N-1) \times Yid/(2^N-1) \times Bkid/(2^N-1));$$

and $$Bki' = Bki + Bka \times (1 - Cid/(2^N-1)) \times Mid/(2^N-1) \times Yid/(2^N-1) \times Bkid/(2^N-1));$$

to thus replace the color values of the reference data with the corrected values.

5. The color proofing method according to claim 4, wherein the step of creating the proof print includes the step of:

changing image data converted by using the corrected look-up table based on the previously determined noise strength and distribution amount indicating the level of a variation of the color of the printing paper for the printing press, to thus make the proof print by the use of the changed image data.

6. A color proofing method for improving the color reproducibility of printed matter to be produced by a printing press in proof print produced by a proof press, the color proofing method comprising the steps of:

creating a look-up table containing converted values of image data over the entire color space with respect to the proof press;

correcting the look-up table based on the color of printing paper for the printing press and a paper exposed area factor in the proof print;

making proof print by the use of the corrected look-up table;

in the case where the proof print is produced based on both of density gradation and area gradation and the colors of the printing paper for the printing press and a printing paper for the proof press are approximated to each other to such an extent as not to need to take the ink transmittance into account, the step of correcting the look-up table includes the steps of:

specifying an influence range defining how far reference data is influenced in the color space when the color values of the printing paper for the printing press are added to the color space; and determining an influence value for each of the reference data based on the color values of the paper and the value of the influence range, to thus add the influence value to the reference data.

7. The color proofing method according to claim 6, wherein the step of creating the proof print includes the step of:

changing image data converted by using the corrected look-up table based on the previously determined noise strength and distribution mount indicating the level of a variation of the color of the printing paper for the printing press, to thus make the proof print by the use of the changed image data.

8. A computer readable medium recording therein a color proofing program for improving the color reproducibility of printed matter to be produced by a printing press in proof print produced by a proof press by the use of a computer, the color proofing program instructing the computer to execute the processes of:

creating a look-up table containing converted values of image data over the entire color space with respect to the proof press;

correcting the look-up table based on the color of printing paper for the printing press and a paper exposed area factor in the proof print;

creating proof print by the use of the corrected look-up table;

in the case where the proof print is produced based on only area gradation and the colors of the printing paper for the printing press and a printing paper for the proof press are approximated to each other to such an extent as not to need to take the ink transmittance into account, the look-up table correcting process includes the processes of:

determining a paper exposed area factor α in accordance with the following equation when arbitrary reference data P in the look-tip table has color values (Cp, Np, Yp, Bkp), each of which is N-bit data:

$$\alpha = (1-Cp/(2^N-1)) \times (1-Mp/(2^N-1)) \times (1-Yp/(2^N-1)) \times (1-Bkp/(2^N-1)),$$

in contrast, determining the paper exposed area factor α in accordance with the following equation when the arbitrary reference data P in the look-up table has the color values (Cp, Mp, Yp, Bkp), each of which is percentage data:

$$\alpha = (1-Cp/100) \times (1-Mp/100) \times (1-Yp/100) \times (1-Bkp/100); \text{ and}$$

determining corrected values (Ci', Ni', Yi', Bki') of color values (Ci, Ni, Yi, Bki) of arbitrary reference data I in the look-up table in accordance with the following equations when color values (Ca, Ma, Ya, Bka) of the printing paper for the printing press are added to a part where a paper exposed area factor is 100%:

$$Ci'=Ci+Ca \times \alpha, \ Mi'=Mi+Ma \times \alpha, \ Yi'=Yi+Ya \times \alpha \text{ and } Bki'=Bki+Bka \times \alpha,$$

to thus replace the color values of the reference data with the corrected values.

9. The computer readable medium recording therein the color proofing program according to claim 8, wherein the proof print creating process includes the process of:

changing image data converted by using the corrected look-up table based on the previously determined noise strength and distribution amount indicating the level of a variation of the color of the printing paper for the printing press, to thus create the proof print by the use of the changed image data.

10. A color proofing apparatus for improving the color reproducibility of printed matter to be produced by a printing press in proof print produced by a proof press by the use of a computer, the color proofing apparatus comprising:

a look-up table creating section for creating a look-up table including converted values of image data over the entire color space with respect to the proof press;

a noise strength and distribution amount input section for setting the noise strength and distribution amount indicating the level of a variation of the color of the printing paper for the printing press;

a paper color input section for specifying the color of the printing paper for the printing press;

a look-up table correcting section for correcting the look-up table based on the color inputted to the paper color input section and a paper exposed area factor in the proof print and an image data converting section for changing the image data converted by the use of the look-up table corrected by the look-up table correcting section based on the noise strength and distribution amount inputted to the noise strength and distribution amount input section, to thus output the changed image data in the case where the proof print is produced based on both of density gradation and area gradation and the colors of the printing paper for the printing press and a printing paper for the proof press are approximated to each other to such an extent as not to need to take the ink transmittance into account, the look-up table correcting section includes:

an influence range input section for specifying an influence range defining how far reference data is influenced in the color space when the color values of the printing paper for the printing press are added to the color space; and an influence value calculating section for determining an influence value for each of the reference data based on the color values of the paper and the value of the influence range, to thus add the influence value to the reference data.

11. A color proofing apparatus for improving the color reproducibility of printed matter to be produced by a printing press in proof print produced by a proof press by the use of a computer, the color proofing apparatus comprising:

a look-up table creating section for creating a look-up table including converted values of image data over the entire color space with respect to the proof press;

a noise strength and distribution amount input section for setting the noise strength and distribution amount indicating the level of a variation of the color of the printing paper for the printing press;

a paper color input section for specifying the color of the printing paper for the printing press;

a look-up table correcting section for correcting the look-up table based on the color inputted to the paper color input section and a paper exposed area factor in the proof print and an image data converting section for changing the image data converted by the use of the look-up table corrected by the look-up table correcting section based on the noise strength and distribution amount inputted to the noise strength and distribution amount input section, to thus output the changed image data;

in the case where the colors of the printing paper for the printing press and a printing paper for the proof press are different from each other to such an extent as to need to take the ink transmittance into account, the look-up table correcting section includes:

a second color corrected value calculating section for determining corrected values (Ci', Ni', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci'=Ci+Ca\times(1-Cid/(2^N-1)\times Mid/(2^N-1)\times Yid/(2^N-1)\times Bkid/(2^N-1));$$

$$Mi'=Mi+Ma\times(1-Cid/(2^N-1)\times Mid/(2^N-1)\times Yid/(2^N-1)\times Bkid/(2^N-1));$$

$$Yi'=Yi+Ya\times(1-Cid/(2^N-1)\times Mid/(2^N-1)\times Yid/(2^N-1)\times Bkid/(2^{-1}));$$

and $$Bki'=Bki+Bka\times(1-Cid/(2^N-1)\times Mid/(2^N-1)\times Yid/(2^N-1)\times Bkid/(2^N-1));$$

to thus replace the color values of the reference data with the corrected values.

12. A computer readable medium recording therein a color proofing program for improving the color reproducibility of printed matter to be produced by a printing press in proof print produced by a proof press by the use of a computer, the color proofing program instructing the computer to execute the processes of:
    creating a look-up table containing converted values of image data over the entire color space with respect to the proof press;
    correcting the look-up table based on the color of printing paper for the printing press and a paper exposed area factor in the proof print;
    creating proof print by the use of the corrected look-up table;
    in the case where the proof print is produced based on both of density gradation and area gradation and the colors of the printing paper for the printing press and a printing paper for the proof press are approximated to each other to such an extent as not to need to take the ink transmittance into account, the look-up table correcting process includes the processes of:
    specifying an influence range defining how far reference data is influenced in the color space when the color values of the printing paper for the printing press are added to the color space; and
    determining an influence value for each of the reference data based on the color values of the paper and the value of the influence range, to thus add the influence value to the reference data.

13. The computer readable medium recording therein the color proofing program according to claim 12, wherein the proof print creating process includes the process of:
    changing image data converted by using the corrected look-up table based on the previously determined noise strength and distribution amount indicating the level of a variation of the color of the printing paper for the printing press, to thus create the proof print by the use of the changed image data.

14. A computer readable medium recording therein a color proofing program for improving the color reproducibility of printed matter to be produced by a printing press in proof print produced by a proof press by the use of a computer, the color proofing program instructing the computer to execute the processes of:
    creating a look-up table containing converted values of image data over the entire color space with respect to the proof press;
    correcting the look-up table based on the color of printing paper for the printing press and a paper exposed area factor in the proof print;
    creating proof print by the use of the corrected look-up table;
    in the case where the colors of the printing paper for the printing press and a printing paper for the proof press are different from each other to such an extent as to need to take the ink transmittance into account, the look-up table correcting process includes the processes of: determining corrected values (Ci', Mi', Yi', Bki') of color values (Ci, Mi, Yi, Bki) of arbitrary reference data I in the look-up table in accordance with the following equations when color values (Ca, Ma, Ya, Bka) of the printing paper for the printing press are added to a part where a paper exposed area factor is 100%, wherein address values (Cid, Mid, Yid, Bkid) express the color values (Ci, Mi, Yi, Bki) by N-bit:

$$Ci'=Ci+Ca\times(1-Cid/(2^N-1)\times Mid/(2^N-1)\times Yid/(2^N-1)\times Bkid/(2^N-1));$$

$$Mi'=Mi+Ma\times(1-Cid/(2^N-1)\times Mid/(2^N-1)\times Yid/(2^N-1)\times Bkid/(2^N-1));$$

$$Yi'=Yi+Ya\times(1-Cid/(2^N-1)\times Mid/(2^N-1)\times Yid/(2^N-1)\times Bkid/(2^N-1));$$

and $$Bki'=Bki+Bka\times(1-Cid/(2^N-1)\times Mid/(2^N-1)\times Yid/(2^N-1)\times Bkid/(2^N-1));$$

to thus replace the color values of the reference data with the corrected values.

15. A computer readable medium recording therein the color proofing program according to claim 14, wherein the proof print creating process includes the process of:
    changing image data converted by using the corrected look-up table based on the previously determined noise strength and distribution amount indicating the level of a variation of the color of the printing paper for the printing press, to thus create the proof print by the use of the changed image data.

* * * * *

UNITED STATES PATENT AND TRADEMARK OFFICE
CERTIFICATE OF CORRECTION

| | |
|---|---|
| PATENT NO. | : 7,123,379 B2 |
| APPLICATION NO. | : 10/052122 |
| DATED | : October 17, 2006 |
| INVENTOR(S) | : Nishida et al. |

It is certified that error appears in the above-identified patent and that said Letters Patent is hereby corrected as shown below:

Column 1, (73) Assignees: "Fusoc" should be -- Fuso --

Column 4, line 24 should read as follows:

$-\alpha = (1-Cp/100) \times (1-Mp/100) \times (1-Yp/100) \times (1-Bkp/100)--;$ Column 5, lines 19-20, should read as follows:

$--Mi' = Mi + Ma \times (1-Cid/(2^N-1) \times Mid/(2^N-1) \times Yid/(2^N-1) \times --$ Signed and Sealed this Twenty-ninth Day of May, 2007

JON W. DUDAS
*Director of the United States Patent and Trademark Office*